United States Patent
Kono

(10) Patent No.: US 6,529,437 B2
(45) Date of Patent: Mar. 4, 2003

(54) SEMICONDUCTOR INTEGRATED CIRCUIT DEVICE HAVING INTERNAL SUPPLY VOLTAGE GENERATING CIRCUIT

(75) Inventor: Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/978,094

(22) Filed: Oct. 17, 2001

(65) Prior Publication Data

US 2002/0176305 A1 Nov. 28, 2002

(30) Foreign Application Priority Data

May 7, 2001 (JP) .................................. 2001-136479

(51) Int. Cl.[7] .............................................. G11C 7/00
(52) U.S. Cl. .................................. 365/226; 365/189.09
(58) Field of Search ................................ 365/226, 207, 365/189.07, 189.09, 190, 202

(56) References Cited

U.S. PATENT DOCUMENTS

| | | |
|---|---|---|
| 6,091,648 A | 7/2000 | Furutani et al. |
| 6,191,971 B1 * | 2/2001 | Tanaka et al. ............... 365/145 |
| 6,195,298 B1 | 2/2001 | Furutani et al. |
| 6,222,223 B1 * | 4/2001 | Tobita ........................ 257/306 |

FOREIGN PATENT DOCUMENTS

| | | |
|---|---|---|
| JP | 6-215571 | 8/1994 |
| JP | 11-250665 | 9/1999 |

OTHER PUBLICATIONS

Kono, et al., A Precharged–Capacitor–Assisted Sensing(P-CAS) Scheme with Novel Level Controller for Low Power DRAM's, Symposium on VLSI Circuits Digest of Technical Papers, Jun. 1999, pp. 123–124.

* cited by examiner

Primary Examiner—David Nelms
Assistant Examiner—Thong Le
(74) Attorney, Agent, or Firm—McDermott, Will & Emery

(57) ABSTRACT

In a precharge operation, when an external supply potential is lower than the lower limit determined by a specification, a VDC circuit in a sense amplifier operating voltage generating circuit supplies to a sense power supply line a potential equal to the external supply potential. When the external supply potential is higher than the lower limit determined by the specification, the VDC circuit supplies a potential equal to the lower limit of the external supply potential. Accordingly, a semiconductor integrated circuit device including this circuitry can achieve power savings without decrease in the sensing operation rate and without supply of charges more than necessary to memory cells.

9 Claims, 9 Drawing Sheets

LEVEL SHIFT CIRCUIT

SEMICONDUCTOR INTEGRATED CIRCUIT DEVICE HAVING INTERNAL SUPPLY VOLTAGE GENERATING CIRCUIT

BACKGROUND OF THE INVENTION

1. Field of the Invention

The present invention relates to semiconductor integrated circuit devices. More specifically, the invention relates to a semiconductor integrated circuit device including a circuit for generating an internal supply voltage to be provided to a sense amplifier.

2. Description of the Background Art

The operating supply voltage of recent semiconductor integrated circuit devices has remarkably been decreasing. As an example, an array operating potential Vdds is now considered that is an operating supply potential of a sense amplifier and is equal to H data written into a memory cell of a dynamic random access memory (DRAM).

In general, array operating potential Vdds is generated by internally decreasing an external supply potential ext.Vdd. Array operating potential Vdds is determined from the reliability of an insulating film which constitutes a memory cell capacitor. The recent reduction in the design rule leads to reduction in the thickness of the insulating film. Then, decrease of a potential difference applied to the film is required. Accordingly, there arises a need for decrease of array operating potential Vdds because of the reduced thickness of the insulating film.

However, in terms of an array operating margin, the lowered level of array operating potential Vdds is disadvantageous.

FIG. 7 is a circuit diagram showing a partial structure of a memory cell array in a DRAM.

Referring to FIG. 7, the memory cell array in the DRAM includes a sense amplifier 30, a bit line equalize circuit 20, and a memory cell 10.

Sense amplifier 30 includes P channel MOS transistors P1 and P2 and N channel MOS transistors N1 and N2.

P channel MOS transistor P1 is connected between a node A3 and a P channel MOS transistor P3, and P channel MOS transistor P2 is connected between a node A4 and P channel MOS transistor P3.

N channel MOS transistor N1 is connected between node A3 and an N channel MOS transistor N3, and N channel MOS transistor N2 is connected between node A4 and N channel MOS transistor N3.

P channel MOS transistor P1 and N channel MOS transistor N1 have respective gates connected to node A4 and P channel MOS transistor P2 and N channel MOS transistor N2 have respective gates connected to node A3. Node A3 is connected to a bit line BL and node A4 is connected to a bit line ZBL.

The source of P channel MOS transistor P3 is connected to an internal supply voltage generating circuit (VDC) 40 via a sense power supply line VSH (interconnect resistance R1) and the gate thereof is connected to a node ZSOP.

N channel MOS transistor N3 is grounded via a node VSL (interconnect resistance R2).

Bit line equalize circuit 20 includes an N channel MOS transistor N4 connected between bit lines BL and ZBL and N channel MOS transistors N5 and N6 connected in series between bit lines BL and ZBL. Respective gates of N channel MOS transistors N4 to N6 are connected to a node A2. The connecting point of N channel MOS transistors N5 and N6 is connected to a node A1. Node A2 receives a bit line equalize signal BLEQ and node A1 receives a bit line potential Vbl. Bit line equalize circuit 20 equalizes the potentials on bit lines BL and ZBL to bit line potential Vbl in response to rising of bit line equalize signal BLEQ to H level of an activation level. Bit line potential Vbl is equal to half of array operating potential, Vdds/2.

Memory cell 10 includes an N channel MOS transistor N7 for access and a capacitor C1 for information storage. The gate of N channel MOS transistor N7 in memory cell 10 is connected to a word line WL of a corresponding row. N channel MOS transistor N7 is connected between bit line BL and one electrode (storage node SN) of capacitor C1. The other electrode of capacitor C1 receives a cell plate potential Vcp. Word line WL activates memory cell 10. Paired bit lines BL and ZBL supply/receive a data signal to and from a selected memory cell.

When memory cell 10 holds H data, a data reading operation is performed as described below.

FIG. 8 is a timing chart showing an operation of sense amplifier 30 in FIG. 7.

Referring to FIG. 8, in a precharge state prior to time T1, bit line equalize signal BLEQ in bit line equalize circuit 20 has H level and accordingly N channel MOS transistors N4 to N6 in bit line equalize circuit 20 are turned on. Then, before time T1, respective potentials on paired bit lines BL and ZBL are precharged to bit line potential Vbl which is the intermediate potential between array operating potential Vdds of an H data potential and ground potential GND of an L data potential.

At time T1, word line WL is activated to H level so that N channel MOS transistor N7 in memory cell 10 is turned on and the H data held in memory cell 10 is transmitted to bit line BL. Consequently, the potential on bit line BL increases from bit line potential Vbl by a minute potential dV. The potential on bit line ZBL stays at bit line potential Vbl and thus a potential difference occurs between paired bit lines BL and ZBL.

At time T2, sense amplifier activation signals ZS0P and S0N become respectively to L and H levels so that P channel MOS transistor P3 and N channel MOS transistor N3 are turned on and sense amplifier 30 is activated. Then, the potential difference between paired bit lines BL and ZBL is amplified and bit line BL and storage node SN of memory cell 10 are raised to array operating potential Vdds which is the potential of H data. Moreover, the potential on bit line ZBL is lowered from bit line potential Vbl to ground potential GND.

It is supposed here that P channel MOS transistors P1 and P2 constituting sense amplifier 30 both have a threshold potential Vthp and N channel MOS transistors N1 and N2 constituting sense amplifier 30 both have a threshold potential Vthn. In order for sense amplifier 30 to start its operation at time T2, it is necessary that gate-source potential Vgs of P channel MOS transistors P1 and P2 should be higher than potential Vthp and gate-source potential Vgs of N channel MOS transistors N1 and N2 should be higher than potential Vthp. Gate-source potential Vgs can be represented by the following equation when minute potential dV is ignored.

$$Vgs = Vbl = Vdds/2$$

Then, for operation of sense amplifier 30, array operating potential Vdds should have the relation below.

$$Vdds > \max(2 \times Vthn, 2 \times |Vthp|) \tag{1}$$

Accordingly, array operating potential Vdds on sense power supply line VSH should be any potential which satisfies relation (1).

Further, an initial operating speed of sense amplifier 30 is determined by respective differences, Vgs−|Vthp| and Vgs−Vthn, between gate-source potential Vgs of respective MOS transistors in sense amplifier 30 and threshold voltages Vthp and Vthn of respective MOS transistors.

In view of this, if threshold voltages Vthp and Vthn of respective transistors vary due to change in a manufacturing process, a decreased array operating potential Vdds results in an insufficient operation margin of sense amplifier 30. In addition, if the decreased array operating potential Vdds makes it impossible to obtain an enough Vgs−|Vthp| or Vgs−Vthn, sense amplifier 30 requires an extended operating time.

After time T2 in FIG. 8, the potentials on sense power supply line VSH and node VSL during operation of sense amplifier 30 change transitionally depending on the interconnect resistances of sense power supply line VSH and node VSL, response rate of VDC circuit 40 and the like. In other words, the potential on sense power supply line VSH decreases to the lowest level at time T3 and the potential on node VSL increases to the highest level at time T3. Such a variation of the potentials on sense power supply line VSH and node VSL during the sensing operation considerably deteriorates the operating speed of sense amplifier 30.

In order to resolve the problem of insufficient operation margin of sense amplifier 30 due to the reduction of array operating potential Vdds, "overdrive method" is proposed as a method of supplying charges to sense power supply line VSH.

First Overdrive Method

One example of the overdrive method is described below that is proposed in Japanese Patent Laying-Open No. 11-250665 and Takasi Kono, 1999 Symposium on VLSI Circuits, Digest of Technical Papers, pp. 123–124.

FIG. 9 is a circuit diagram showing a partial structure of a memory cell array in a DRAM including a sense amplifier drive circuit according to the overdrive method.

Referring to FIG. 9, a sense amplifier operating voltage generating circuit 90 is provided instead of VDC circuit 40 in the circuit diagram of FIG. 7.

FIG. 10 is a circuit diagram of sense amplifier operating voltage generating circuit 90 in FIG. 9.

Referring to FIG. 10, sense amplifier operating voltage generating circuit 90 includes a reference potential generating circuit 100, a selector circuit 150, a shifter circuit 160, a VDC circuit 170, a P channel driver circuit 200 and a decoupling capacitor C2.

Reference potential generating circuit 100 includes a low-pass filter (LPF) 110 for eliminating noise on an external supply potential ext.Vdd, a constant current circuit 120, and an output circuit 130 for outputting a predetermined voltage. Output circuit 130 includes a first reference potential output stage 131 and a second reference potential output stage 136.

Low-pass filter 110 includes a resistor R20 and a capacitor C20 connected in series between an external supply node ext.Vdd and a ground node GND, and outputs to constant current circuit 120 a potential with noise on external supply potential ext.Vdd removed therefrom.

Constant current circuit 120 includes a P channel MOS transistor P10 having its source connected to a node A5 and its gate and drain connected to a node A6, an N channel MOS transistor N10 connected between node A6 and ground node GND and having its gate connected to a node A7, a resistor R21 connected between node A5 and the source of a P channel MOS transistor P11, P channel MOS transistor P11 connected between resistor R21 and node A7 and having its gate connected to node A6, and an N channel MOS transistor N11 having its source connected to ground node GND and drain and gate connected to node A7.

Constant current circuit 120 generates a constant current Ir which does not depend on external supply potential ext.Vdd.

The first reference potential output stage 131 in output circuit 130 is constituted of P channel MOS transistors P12 to P15. P channel MOS transistor P12 simply supplies constant current Ir while P channel MOS transistors P13 to P15 operate as resistors. Then, the first reference potential output stage 131 outputs a potential Vrefs equal to an array operating potential Vdds. The second reference potential output stage 136 constituted of P channel MOS transistors P16 to P19 outputs a potential Vrefp equal to an internal potential Vddp used by peripheral circuitry of the memory cell array portion.

Selector circuit 150 includes a transfer gate 151 connected to the second reference potential output stage 136, a transfer gate 152 connected to the first reference potential output stage 131, and an inverter 153. Transfer gates 151 and 152 have respective gates receiving a signal PRE for inactivating a row-related circuit to output potential Vrefp when signal PRE has H level and output potential Vrefs when signal PRE has L level.

Shifter circuit 160 includes an N channel MOS transistor N20 connected between nodes A10 and A12 and having its gate receiving an output signal from selector circuit 150, an N channel MOS transistor N22 connected between node A10 and ground node GND and having its gate connected to a node A11, an N channel MOS transistor N21 connected between nodes A12 and A11 and having its gate receiving a potential on a sense power supply line VSH, and an N channel MOS transistor N23 having its gate and drain connected to node A11 and its source connected to ground node GND. A signal REF is output from node A10 of shifter circuit 160 while a signal SIG is output from node A11.

VDC circuit 170 includes a comparator 180 constituted of a differential amplifier circuit and a P channel driver circuit 190 including a P channel MOS transistor P22 connected to sense power supply line VSH and external supply node ext.Vdd.

Comparator 180 includes a P channel MOS transistor P20 having its source connected to a node A13 supplied with external supply potential ext.Vdd and having its gate and drain connected to a node A14, an N channel MOS transistor N24 connected between nodes A14 and A16 and having its gate receiving signal SIG, a P channel MOS transistor P21 connected between nodes A13 and A15 and having its gate connected to node A14, an N channel MOS transistor N25 connected between nodes A15 and A16 and having its gate receiving signal REF, and an N channel MOS transistor N26 connected between node A16 and ground node GND and having its gate receiving external supply potential ext.Vdd.

P channel MOS transistor P22 in P channel driver circuit 190 receives, at its gate, an output potential from comparator 180 and supplies the potential to sense power supply line VSH.

Signals SIG and REF supplied from shifter circuit 160 change in respective ranges centering on respective levels which are respectively almost a half of the potential from selector circuit 150 and almost a half of the potential on sense power supply line VSH. Then, N channel MOS transistors N24 and N25 in comparator 180 receiving these signals can operate in a saturation region even if the potential on node A16 is close to the ground potential. As a result, gate-source potential Vgs of P channel MOS transistor P22 in P channel driver circuit 190 can be increased. In other words, even if the transistor size of P channel MOS transistor P22 is relatively small, the VDC circuit having a satisfactory current supply capability can be implemented.

P channel driver circuit 200 includes a P channel MOS transistor P23 connected between an internal potential node Vddp and sense power supply line VSH and an inverter 202 connected to the gate of P channel MOS transistor P23.

P channel MOS transistor P23 in P channel driver circuit 200 is turned on when signal PRE has H level to supply internal potential Vddp to sense power supply line VSH.

Sense amplifier operating voltage generating circuit 90 having the above circuit structure according to the overdrive method operates as discussed below.

FIG. 11 is a timing chart showing an operation of sense amplifier operating voltage generating circuit 90 shown in FIG. 10.

Referring to FIG. 11, in a precharge state prior to time T4, signal PRE has H level so that an output signal supplied from selector circuit 150 is potential Vrefp. Then, internal potential Vddp equal to potential Vrefp is supplied from VDC circuit 170 to sense power supply line VSH at the time of precharge. At the same time, P channel MOS transistor P23 in P channel driver circuit 200 is turned on so that internal potential Vddp is supplied from P channel driver circuit 200 to sense power supply line VSH.

Accordingly, when signal PRE has H level before time T4, sense power supply line VSH and decoupling capacitor C2 are always supplied with internal potential Vddp at the time of precharge.

Prior to time T4 when word line WL is activated, signal PRE becomes L level. Then, P channel MOS transistor P23 in P channel driver 200 is turned off and accordingly sense power supply line VSH and decoupling capacitor C2 are separated from internal potential Vddp. The potential output from selector circuit 150 is potential Vrefs so that the potential supplied from VDC circuit 170 to sense power supply line VSH is array operating potential Vdds.

At time T5, activation signals S0N and ZS0P become H and L levels respectively to start the operation of sense amplifier 30. Then, charges accumulated on decoupling capacitor C2 flow onto sense power supply line VSH. As a result, the potential on sense power supply line VSH decreases lower than array operating potential Vdds to a decreased extent and accordingly a higher rate of the sense amplify operation is achieved.

The capacitance of decoupling capacitor C2 can appropriately be set to make the potential on sense power supply line VSH after completion of sensing operation equal to array operating potential Vdds which is H data potential. However, the potential supplied from VDC circuit 170 to sense power supply line VSH at time T4 is array operating potential Vdds, therefore, even if sense power supply line VSH has its potential equal to or lower than array operating potential Vdds due to insufficient charges accumulated on the decoupling capacitor in the sensing operation, VDC circuit 170 supplies charges corresponding to the shortage of charges. In this way, the potential on sense power supply line VSH is kept at array operating potential Vdds.

Sense amplifier operating voltage generating circuit 90 having the circuit structure shown in FIG. 10 can be used to increase the rate of sensing operation in the initial stage relative to the conventional sense amplifier and thus a sufficient sense margin can be secured even at a low array operating potential Vdds.

The reason for the above advantage is that, in the initial stage of sensing operation by sense amplifier operating voltage generating circuit 90, gate-source potential Vgs of each MOS transistor in sense amplifier 30 increases from the conventional (Vdds/2) to (Vddp−Vdds/2) by (Vddp−Vdds).

The sensing operation by sense amplifier operating voltage generating circuit 90 having the circuit structure shown in FIG. 10 is effective when external supply potential ext.Vdd, internal potential Vddp and array operating potential Vdds have the following relation:

external supply potential ext.Vdd>internal potential Vddp>array operating potential Vdds.

Second Overdrive Method

Another example of the overdrive method is disclosed as an overdrive sensing method in Japanese Patent Laying-Open No. 11-250665 described below.

FIG. 12 is a circuit diagram of a sense amplifier drive circuit according to the second overdrive method.

Referring to FIG. 12, a sense amplifier operating voltage generating circuit 300 includes a reference potential generating circuit 301 outputting a potential Vrefs equal to an array operating potential Vdds, a VDC circuit 306, a P channel driver circuit 307 and a decoupling capacitor C3.

Reference potential generating circuit 301 generates reference potential Vrefs equal to array operating potential Vdds and supplies reference potential Vrefs to VDC circuit 306.

VDC circuit 306 includes a comparator 302 and a P channel driver circuit 303. Comparator 302 is a differential amplifier circuit constituted of P channel MOS transistors P20 and P21 and N channel MOS transistors N24, N25 and N26. The gate of N channel MOS transistor N24 receives the potential on a sense power supply line VSH while the gate of N channel MOS transistor N25 receives reference potential Vrefs. P channel driver circuit 303 includes a P channel MOS transistor P22 connected between an external supply potential ext.Vdd and sense power supply line VSH.

P channel driver circuit 307 includes a P channel MOS transistor P30 which is connected between external supply node ext.Vdd and sense power supply line VSH and has its gate supplied with a signal φ.

Sense amplifier operating voltage generating circuit 300 having the above circuit structure operates as described below.

FIG. 13 is a timing chart showing an operation of sense amplifier operating voltage generating circuit 90 shown in FIG. 12.

Referring to FIG. 13, prior to time T6, signal φ is at L level so that P channel MOS transistor P30 is turned on and sense power supply line VSH is precharged to external supply potential ext.Vdd.

At time T6, sense amplifier activation signals S0N and ZS0P become respectively to H and L levels to start the operation of sense amplifier 30. Then, each MOS transistor in sense amplifier 30 has its gate-source potential Vgs higher than the conventional one. Signal φ stays at L level until time T7 and sense power supply line VSH is provided with external supply potential ext.Vdd and accordingly the sense amplifier operation is increased in rate. On the other hand, if there is a shortage of charges required for sensing operation after time T7, charges are supplied from VDC circuit 306 and accordingly the potential on sense power supply line VSH is maintained at array operating potential Vdds.

When sense amplifier operating voltage generating circuit 90 or 300 according to the overdrive method as described above is employed to perform a sensing operation, the potential on sense power supply line VSH in sensing operation never exhibits such a remarkable decrease as that occurs at time T3 in FIG. 8. Consequently, the rate of sensing operation can be increased.

However, a problem arises when, in a semiconductor integrated circuit including the sense amplifier operating voltage generating circuit of the overdrive method, external supply potential ext.Vdd is decreased for the purpose of saving power.

It is supposed here that external supply potential ext.Vdd to be provided to a semiconductor integrated circuit device including a sense amplifier operating voltage generating circuit of the overdrive method is reduced for saving power, and consequently the relation, external supply potential ext.Vdd=internal potential Vddp is established.

In this case, in sense amplifier operating voltage generating circuits 90 and 300 of the overdrive method, respective decoupling capacitors C2 and C3 being precharged are both supplied with external supply potential ext.Vdd. Here, external supply potential ext.Vdd varies in an allowable range defined by a specification. Then, the amount of charges accumulated on decoupling capacitors C2 and C3 being precharged varies.

If the amount of accumulated charges is smaller than that necessary for a sensing operation, an amount of charges corresponding to the shortage is provided from VDC circuits 170 and 306 and thus no problem occurs. However, if the variation of external supply potential ext.Vdd causes the amount of accumulated charges to be larger than a necessary amount of charges, the potential on sense power supply line VSH in sensing operation becomes higher than H data potential which is not preferable in terms of reliability of memory cells.

Specifically, suppose that capacitance of decoupling capacitors C2 and C3 is Cd, total amount of negative charges on bit line BL or ZBL is Cba, precharge potential on sense power supply line VSH is Vpre and precharge level of a bit line is Vbl (=Vdds/2), and the following relation is satisfied.

$$Cd \times (Vpre-Vdds) = Cba \times Vbl \quad (2)$$

In this case, if external supply potential ext.Vdd is higher than precharge potential Vpre, the potential on sense power supply line VSH in sensing operation is higher than H data potential which is not preferable in terms of reliability.

SUMMARY OF THE INVENTION

One object of the present invention is to provide a semiconductor integrated circuit device achieving power savings without decrease in the operating rate of a sense amplifier and without supply of charges more than necessary to a memory cell.

A semiconductor integrated circuit device according to the present invention includes paired bit lines, a memory cell connected to one of the paired bit lines, a sense amplifier for amplifying a potential difference between the paired bit lines generated by reading of data from the memory cell, and a sense amplifier operating voltage generating circuit for supplying a voltage accumulated in the memory cell to the sense amplifier in an active period of the sense amplifier. The sense amplifier operating voltage generating circuit includes an internal potential supply node connected to the sense amplifier, a first voltage supply circuit for outputting, when an external supply voltage is higher than a predetermined voltage, the predetermined voltage as an output voltage to the internal potential supply node and outputting, when the external supply voltage is lower than the predetermined voltage, a voltage equal to the external supply voltage as an output voltage to the internal potential supply node, and a decoupling capacitor connected to the internal potential supply node.

Preferably, the first voltage supply circuit is stopped from operating in the active period of the sense amplifier.

Still preferably, the first voltage supply circuit includes a reference voltage generating circuit for outputting a voltage lower than the external supply voltage as a reference voltage, a shift circuit for reducing the output voltage to output the reduced voltage, and a voltage downconverter circuit receiving the reference voltage and the reduced voltage to output the output voltage.

Still more preferably, the voltage downconverter circuit includes a comparator circuit receiving the reference voltage and the reduced voltage to output a result of comparison between the reference voltage and the reduced voltage, and a switching element connected to an external supply node receiving the external supply voltage and the internal potential supply node, and the switching element receives the result of comparison from the comparator circuit to control the output voltage of the internal potential supply node.

Accordingly, it is possible to avoid charges more than necessary from being supplied to bit lines in a sense amplifier operation.

Still more preferably, the shift circuit includes a plurality of resistor elements connected in series between the internal potential supply node and a ground node.

The output voltage can thus be reduced.

Still more preferably, the shift circuit includes a first transistor and a second transistor connected in series between the external supply node and the ground node, and the output voltage is input to a control electrode of the first transistor and the reference voltage is input to a control electrode of the second transistor.

Then, variations of the output voltage can readily be adjusted due to changes of manufacture process of the semiconductor integrated circuit device.

Still more preferably, the sense amplifier operating voltage generating circuit further includes a second voltage supply circuit for outputting the predetermined voltage to the internal potential supply node when the output voltage held in the decoupling capacitor by charging is lower than the predetermined voltage in an inactive period of the sense amplifier.

Still more preferably, the second voltage supply circuit supplies the predetermined voltage in the active period of the sense amplifier.

Accordingly, a shortage of charges can be prevented that are to be supplied to bit lines in a sense amplifier operation.

Still more preferably, the predetermined voltage is a lower limit of the external supply voltage determined by a specification.

Then, excessive supply of charges to bit lines due to variations of the external supply voltage can be prevented.

According to the present invention, the semiconductor integrated circuit device can be provided that achieves power savings without decrease in the operating rate of the sense amplifier.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
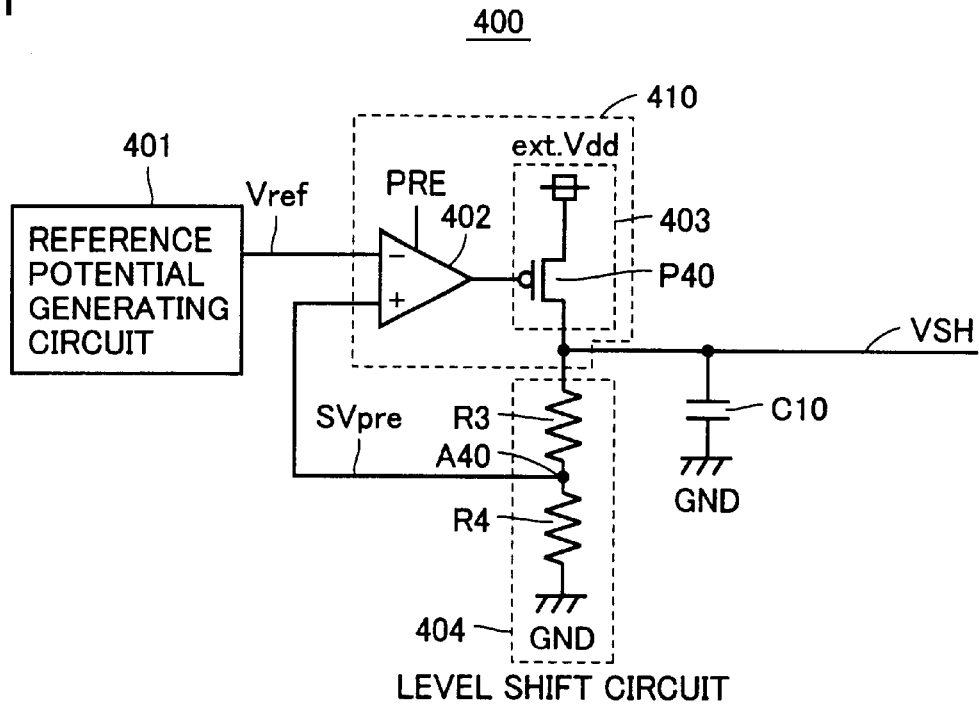
FIG. 1 is a circuit diagram of a sense amplifier operating voltage generating circuit according to an embodiment of the present invention.

Embodiments of the present invention are hereinafter described in detail in conjunction with the drawings. The same or corresponding components in the drawings are denoted by the same reference character and description thereof is not repeated.

First Embodiment

FIG. 1 is a circuit diagram of a sense amplifier operating voltage generating circuit according to a first embodiment of the present invention.

Referring to FIG. 1, sense amplifier operating voltage generating circuit 400 includes a reference potential generating circuit 401, a comparator 402, a P channel driver circuit 403, a level shift circuit 404 and a decoupling capacitor C10.

P channel driver circuit 403 includes a P channel MOS transistor P40. The source of P channel MOS transistor P40 is connected to an external supply node ext.Vdd and the drain thereof is connected to a sense power supply line VSH. The gate of P channel MOS transistor P40 receives an output signal from comparator 402. Decoupling capacitor C10 is connected between sense power supply line VSH and a ground node GND.

Level shift circuit 404 is constituted of resistor elements R3 and R4 connected in series between sense power supply line VSH and ground node GND and outputs a potential from a node A40 connecting resistor elements R3 and R4, the potential generated by dividing the potential on sense power supply line VSH.

Figure 2:
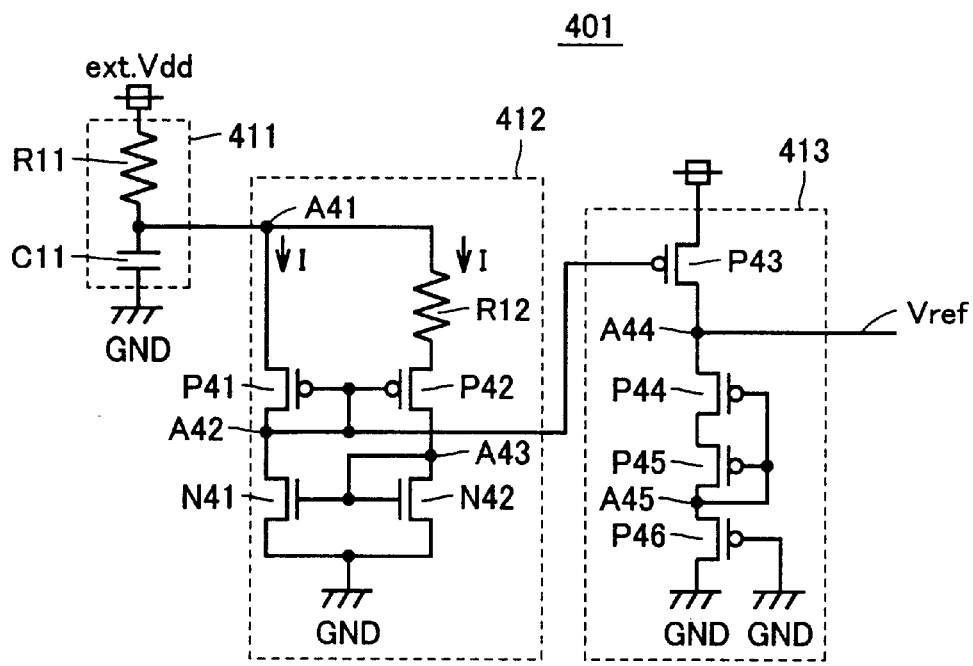
FIG. 2 is a circuit diagram of a reference potential generating circuit shown in FIG. 1.

FIG. 2 is a circuit diagram of reference potential generating circuit 401 shown in FIG. 1.

Referring to FIG. 2, reference potential generating circuit 401 includes a low-pass filter 411, a constant current circuit 412, and an output circuit 413 controlled by constant current circuit 412 to output a reference potential Vref.

Low-pass filter 411 includes a resistor R11 and a capacitor C11 connected in series between external supply node ext.Vdd and ground node GND.

Low-pass filter 411 receives an external supply potential ext.Vdd to remove noise therefrom and supplies a resultant potential to a node A41.

Constant current circuit 412 includes a P channel MOS transistor P41 having its source connected to node A41 and gate and drain connected to a node A42, an N channel MOS transistor N41 connected between node A42 and ground node GND and having its gate connected to a node A43, a resistor R12 connected between node A41 and the source of a P channel MOS transistor P42, P channel MOS transistor P42 connected between resistor R12 and node A43 and having its gate connected to node A42, and an N channel MOS transistor N42 having its source connected to ground node GND and drain and gate connected to node A43.

N channel MOS transistors N41 and N42 form a current mirror circuit. Respective current driving capabilities of N channel MOS transistors N41 and N42 are made equal so that the same current I flows through two branches between external supply node ext.Vdd and ground node GND. Moreover, P channel MOS transistors P41 and P42 are operated in a subthreshold region and the current driving capability of P channel MOS transistor P41 is made smaller than that of P channel MOS transistor P42. Then, current I is a constant current independent of external supply potential ext.Vdd.

Output circuit 413 includes a P channel MOS transistor P43 connected between external supply node ext.Vdd and a node A44 and having its gate connected to node A42 of constant current circuit 412, P channel MOS transistors P44 and P45 connected in series between nodes A44 and A45 and having respective gates both connected to node A45, and a P channel MOS transistor P46 having its source connected to node A45 and gate and drain connected to ground node GND.

P channel MOS transistor P43 forms a current mirror together with constant current circuit 412 and accordingly current I is correctly duplicated. P channel MOS transistors P44 and P45 have channel resistance components and P channel MOS transistor P46 has a threshold component which is a resistance component determined chiefly by a threshold.

Positive temperature characteristics of current I are reflected in the channel resistance components while the threshold component has negative temperature characteristics. Accordingly, these characteristics can be balanced to eliminate temperature characteristics of reference potential Vref.

Figure 3:
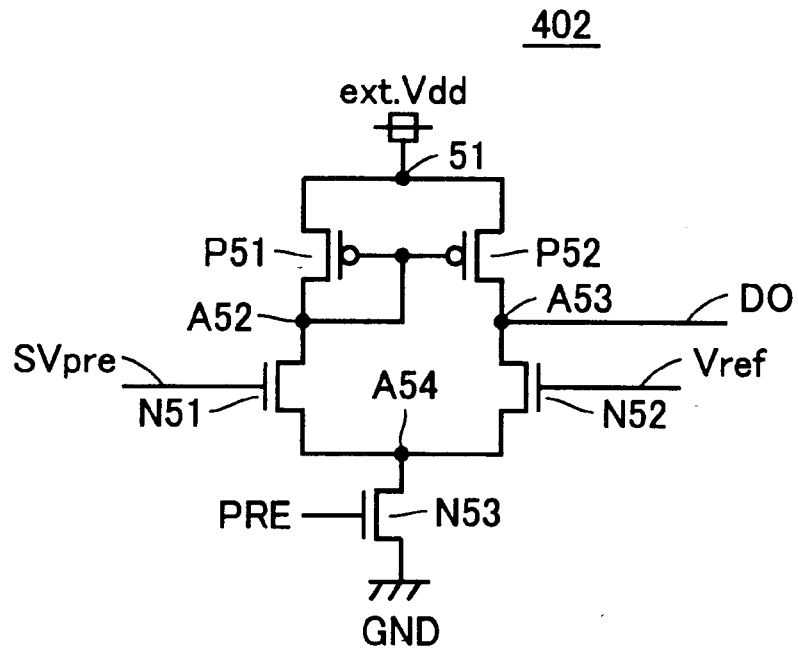
FIG. 3 is a circuit diagram of a comparator shown in FIG. 1.

FIG. 3 is a circuit diagram of comparator 402 shown in FIG. 1.

Referring to FIG. 3, comparator 402 includes a P channel MOS transistor P51 having its source connected to a node A51 provided with external supply potential ext.Vdd and its gate and drain connected to a node A52, an N channel MOS transistor N51 connected between nodes A52 and A54 and having its gate receiving a shift output potential SVpre supplied from level shift circuit 404, a P channel MOS transistor P52 connected between nodes A51 and A53 and having its gate connected to node A52, an N channel MOS transistor N52 connected between nodes A53 and A54 and having its gate receiving reference potential Vref, and an N channel MOS transistor N53 connected between node A54 and ground node GND and having its gate receiving a signal PRE.

When signal PRE has H level, N channel MOS transistor N53 is turned on and accordingly comparator 402 outputs a signal DO from node A53. When signal PRE has L level, comparator 402 stops its operation.

Sense amplifier operating voltage generating circuit 400 operates as described below when external supply potential ext.Vdd is reduced for power saving and consequently becomes equal to an internal potential Vddp. Here, an array operating potential Vdds equal to an H data potential written into a memory cell is a constant potential lower than a potential ext.Vdd (min) which is the lower limit of external supply potential ext.Vdd defined by a specification.

Reference potential Vref supplied from reference potential generating circuit 401 is set so that the relation represented by the following equation is established between reference potential Vref and potential ext.Vdd (min) which is the lower limit of external supply potential ext.Vdd defined by a specification.

$$Vref = \alpha \times ext.Vdd \text{ (min)} \quad (3)$$

Here, α is smaller than 1 (α<1). Namely, reference potential Vref is made smaller than potential ext.Vdd (min). The reason is that, if reference potential Vref is made equal to potential ext.Vdd (min) in reference potential generating circuit 401 and external supply potential ext.Vdd is actually close to potential ext.Vdd (min), it is difficult for circuitry to generate a constant reference potential Vref which is independent of external supply potential ext.Vdd. In addition, there may be a case in which external supply potential ext.Vdd becomes smaller than the lower limit potential ext.Vdd (min) defined by a specification for some reason such as a transient decrease of external supply potential ext.Vdd in use. Then, reference potential generating circuit 401 receiving a potential from its power source, i.e., external supply potential ext.Vdd, cannot output a potential higher than external supply potential ext.Vdd. Accordingly, the relation, reference potential Vref<potential ext.Vdd (min) is established. In order to adapt to a greater variation of external supply potential ext.Vdd, reference potential Vref is preferably set smaller than potential ext.Vdd (min).

The relation between a precharge potential Vpre and reference potential Vref is set as represented by the following equation, where precharge potential Vpre is a potential output to sense power supply line VSH from P channel driver circuit 403 in a precharge operation.

$$Vpre = Vref/\alpha \quad (4)$$

Further, resistance values of resistors R3 and R4 in level shift circuit 404 are set so that shift output potential SVpre supplied from level shift circuit 404 satisfies the relation represented by the following equation.

$$SVpre = \alpha \times Vpre \quad (5)$$

A relation is now described between variation of external supply potential ext.Vdd and precharge potential Vpre supplied from VDC circuit 410 at the time of precharge.

At the time of precharge, signal PRE supplied to comparator 402 in VDC circuit 410 has H level. Comparator 402 then receives reference potential Vref determined by equation (3) and shift output potential SVpre determined by equation (5) to output to P channel driver circuit 403 signal DO according to the potential difference between reference potential Vref and shift output potential SVpre. In response to variation of external supply potential ext.Vdd, P channel driver circuit 403 in VDC circuit 410 outputs precharge potential Vpre to sense power supply line VSH as detailed below.

(1) External supply potential ext.Vdd is smaller than potential ext.Vdd (min) which is the lower limit of external supply potential ext.Vdd defined by a specification.

In this case, precharge potential Vpre supplied from P channel driver 403 is lower than potential ext.Vdd (min) and accordingly shift output potential SVpre output from level shift circuit 404 is always smaller than reference potential Vref.

As a result, the potential of signal DO supplied from comparator 402 decreases and P channel MOS transistor P40 in P channel driver circuit 403 is constantly made on.

Accordingly, precharge potential Vpre output from P channel driver circuit 403 is always equal to external supply potential ext.Vdd. Then, external supply potential ext.Vdd is supplied to decoupling capacitor C10 in a precharge operation.

(2) External supply potential ext.Vdd is higher than potential ext.Vdd (min).

In this case, if charging by P channel driver circuit 403 causes precharge potential Vpre to be higher than potential ext.Vdd (min), shift output potential SVpre output from level shift circuit 404 is higher than reference potential Vref.

The potential of signal DO supplied from comparator 402 accordingly increases so that P channel MOS transistor P40 is turned off.

P channel driver circuit 403 is thus controlled to make precharge potential Vpre on sense power supply line VSH equal to potential ext.Vdd (min).

Then, precharge potential Vpre on sense power supply line VSH is always equal to potential ext.Vdd (min) and potential ext.Vdd (min) is supplied to decoupling capacitor C10 in a precharge operation.

Figure 4:
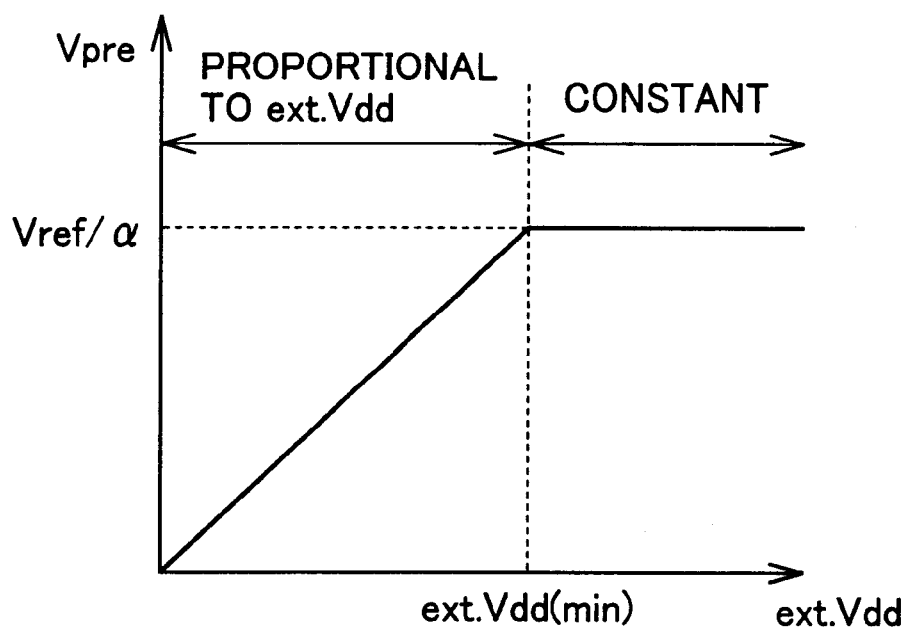
FIG. 4 shows a relation between a precharge potential Vpre on a sense power supply line VSH and an external supply potential ext.Vdd at the time of precharge when the sense amplifier operating voltage generating circuit is used.

When sense amplifier operating voltage generating circuit 400 shown in FIG. 1 and operating as described above is used, precharge potential Vpre on sense power supply line VSH and external supply potential ext.Vdd have a relation as shown in FIG. 4.

From the relation shown in FIG. 4 between precharge potential Vpre and external supply potential ext.Vdd and equation (2), it is possible to determine a capacitance Cd of decoupling capacitor C10 in FIG. 1 by the following equation.

$$Cd = Cba \times Vble/(ext.Vdd(\text{min}) - Vdds) \quad (6)$$

In a sensing operation, signal PRE supplied to the comparator is off and accordingly sense amplifier operating voltage generating circuit 400 shown in FIG. 1 is stopped from operating. Then, in the sensing operation, charges accumulated on decoupling capacitor C10 during a precharge operation are supplied to sense power supply line VSH in order to prevent decrease in the operating rate of a sense amplifier.

By the operation as described above, precharge potential Vpre, i.e., a charging potential accumulated on the decoupling capacitor is made equal to or smaller than potential ext.Vdd (min) which is the lower limit of external supply potential ext.Vdd allowable in terms of specification. Then, even if external supply potential ext.Vdd changes in a precharge operation, a potential higher than the H data potential is never supplied to sense power supply line VSH. Further, the sense amplifier operating voltage generating circuit is operated in the precharge operation to accumulate charges on decoupling capacitor C10 in the precharge so as to increase gate-source voltage Vgs of a MOS transistor constituting a sense amplifier in the initial stage of a sense amplifier operation. Consequently, a fast sensing operation is possible.

Second Embodiment

In the first embodiment, precharge potential Vpre is divided by resistors employed in the level shift circuit.

However, there arises a need in this case to provide certain adjustment mechanisms respectively for the reference potential generating circuit and the level shift circuit in order to prevent precharge potential Vpre from changing due to process change such as variations in manufacture, and consequently, the size of circuitry increases. In view of this, the sense amplifier operating voltage generating circuit preferably includes only one adjustment mechanism.

Figure 5:
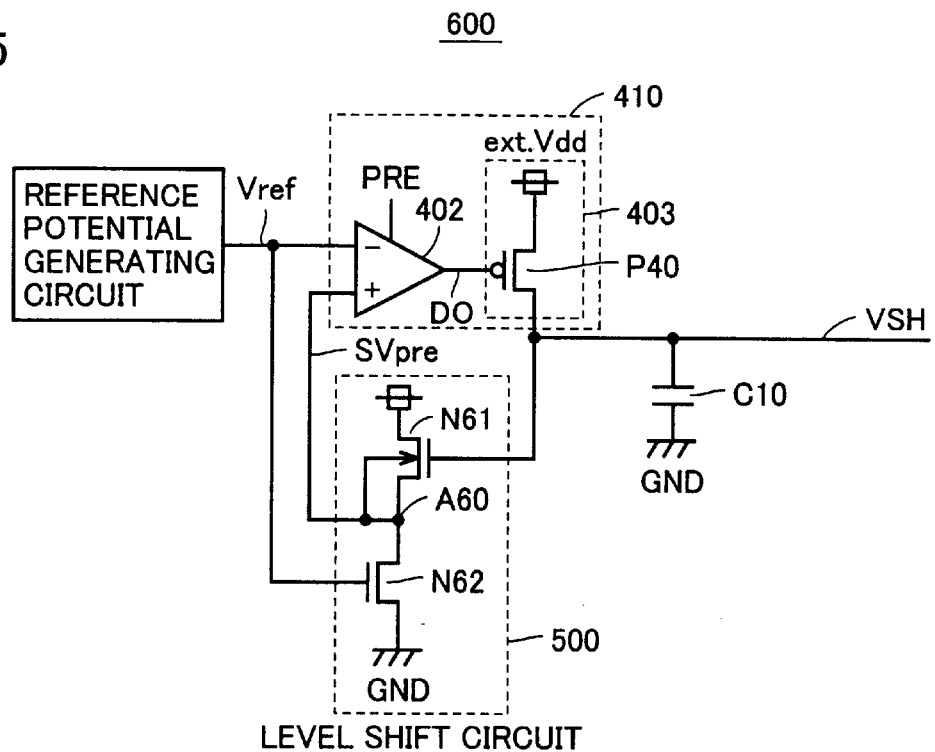
FIG. 5 is a circuit diagram of a sense amplifier operating voltage generating circuit according to a second embodiment of the present invention.

FIG. 5 is a circuit diagram of a sense amplifier operating voltage generating circuit 600 according to a second embodiment of the present invention.

Referring to FIG. 5, a level shift circuit 500 is provided instead of level shift circuit 404 in FIG. 1.

Level shift circuit 500 includes N channel MOS transistors N61 and N62 connected in series between an external supply node ext.Vdd and a ground node. The gate of N channel MOS transistor N61 is supplied with a potential on a sense power supply line VSH while the gate of N channel MOS transistor N62 is supplied with a reference potential Vref. A shift output potential SVpre is output to a comparator 402 from a node A60 connecting N channel MOS transistors N61 and N62.

Other structural components of the circuitry are the same as those in FIG. 2 and description thereof is not repeated.

An operation is described below of sense amplifier operating voltage generating circuit 600 having the circuit structure shown in FIG. 5. Here, an array operating potential Vdds equal to an H data potential to be written into a memory cell is a constant potential lower than a potential ext.Vdd (min) which is the lower limit of an external supply potential ext.Vdd defined by a specification.

It is supposed that reference potential Vref output from a reference potential generating circuit 401 is represented by $$Vref = ext.Vdd(min)/2$$

and that N channel MOS transistors N61 and N62 in level shift circuit 500 have the same size and operate in a saturation region.

In this case, level shift circuit 500 provides shift output potential SVpre represented by the following equation.

$$SVpre = Vpre/2$$

At this time, a P channel driver circuit 403 in a VDC circuit 410 outputs a precharge potential Vpre to sense power supply line VSH in response to variation of external supply potential ext.Vdd as detailed below.

(1) External supply potential ext.Vdd is smaller than potential ext.Vdd (min) which is the lower limit of external supply potential ext.Vdd in terms of specification.

In this case, precharge potential Vpre supplied from P channel driver 403 is lower than potential ext.Vdd (min). Then, a decreased potential is supplied to the gate of N channel MOS transistor N61 in level shift circuit 500 and consequently shift output potential SVpre is lower than reference potential Vref (SVpre<Vref).

Accordingly, the potential of signal DO output from comparator 402 decreases and a P channel MOS transistor P40 in P channel driver 403 is constantly made on.

Precharge potential Vpre output from P channel driver 403 is thus always equal to external supply potential ext.Vdd and external supply potential ext.Vdd is provided to a decoupling capacitor C10 in a precharge operation.

(2) External supply potential ext.Vdd is higher than potential ext.Vdd (min).

In this case, if charging by P channel driver 403 causes precharge potential Vpre to be higher than potential ext.Vdd (min), the gate potential of N channel MOS transistor N61 in level shift circuit 500 increases and consequently shift output potential SVpre is higher than reference potential Vref (SVpre>Vref).

Then, the potential output from comparator 402 decreases and P channel MOS transistor P40 is turned off.

P channel driver circuit 403 is thus controlled to make precharge potential Vpre on sense power supply line VSH equal to potential ext.Vdd (min).

By the operation as described above, a relation is established between precharge potential Vpre and external supply potential ext.Vdd as shown by the graph in FIG. 4 like the relation accomplished by sense amplifier operating voltage generating circuit 400 according to the first embodiment.

Regarding the sense amplifier operating voltage generating circuit having the structure shown in FIG. 5, adaptation to variation of precharge potential Vpre due to manufacture variations and the like is possible by adjusting reference potential Vref only and no extra adjustment mechanism is necessary. As a result, the size of circuitry can be kept small.

Third Embodiment

The sense amplifier operating voltage generating circuits according to the first and second embodiments are stopped from operating when signal PRE becomes L level in a sensing operation. Accordingly, in the sensing operation, charges accumulated on the decoupling capacitor are supplied to sense power supply line VSH.

In the actual use, external supply potential ext.Vdd could become lower than potential ext.Vdd (min). In this state, precharge potential Vpre is smaller than potential ext.Vdd (min) (Vpre<ext.Vdd (min)). The capacitance of the decoupling capacitor is fixed that is determined by equation (6). Therefore, if external supply potential ext.Vdd becomes lower than potential ext.Vdd (min), the total charge required for a sensing operation cannot be accumulated on the decoupling capacitor.

Then, it is desirable that the potential on sense power supply line VSH in a sensing operation can be maintained at array operating potential Vdds equal to H data potential even if external supply potential ext.Vdd is lower than potential ext.Vdd (min).

Figure 6:
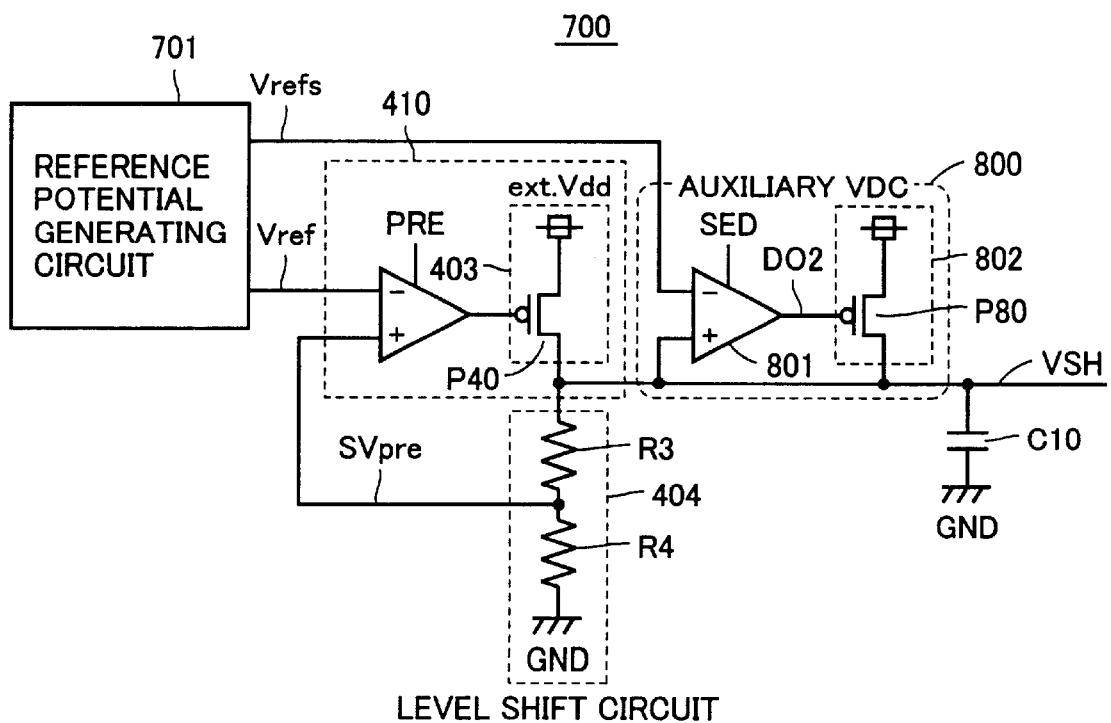
FIG. 6 is a circuit diagram of a sense amplifier operating voltage generating circuit according to a third embodiment of the present invention.
Figure 7:
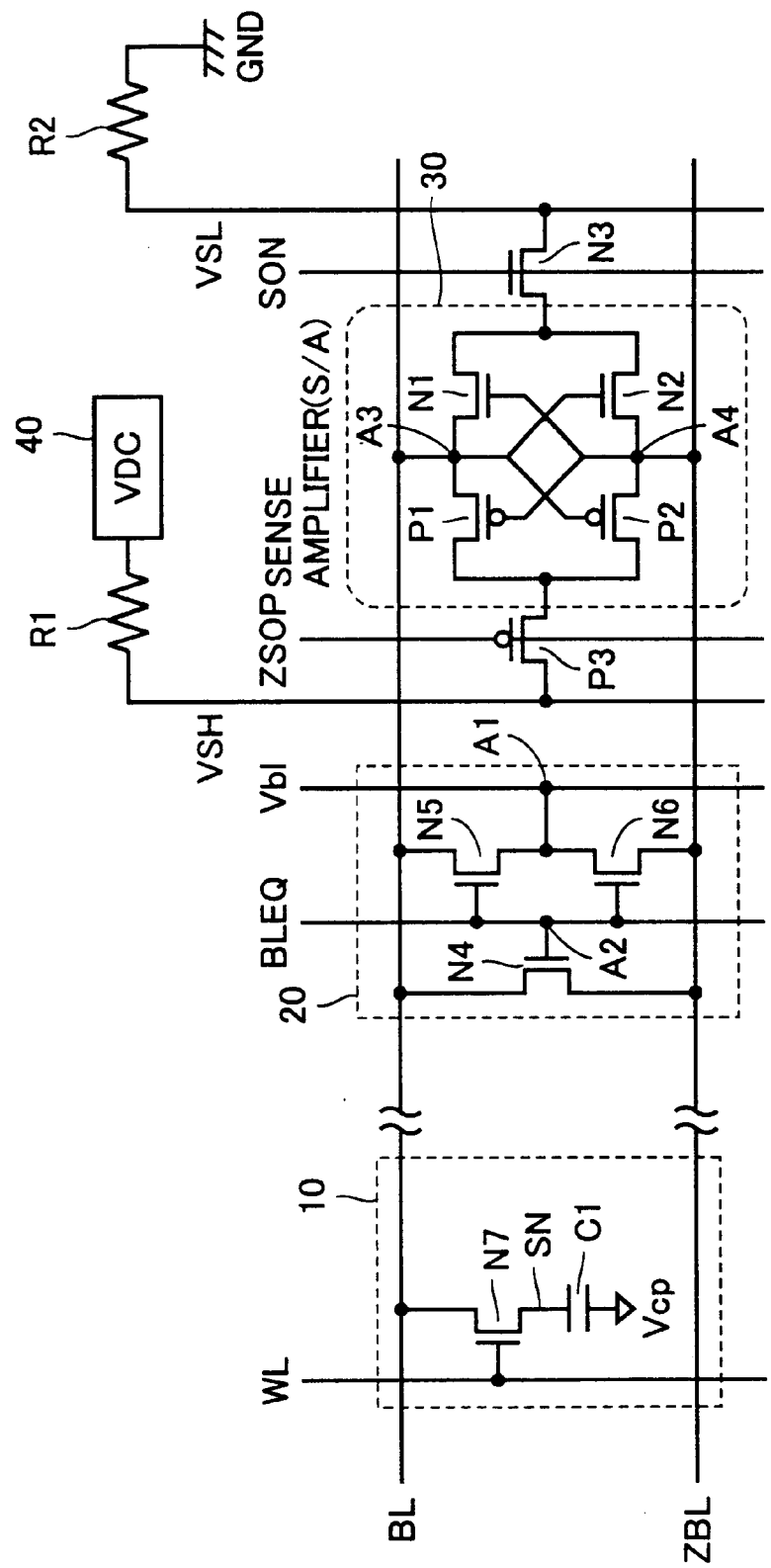
FIG. 7 is a circuit diagram showing a partial structure of a memory cell array in a DRAM.
Figure 8:
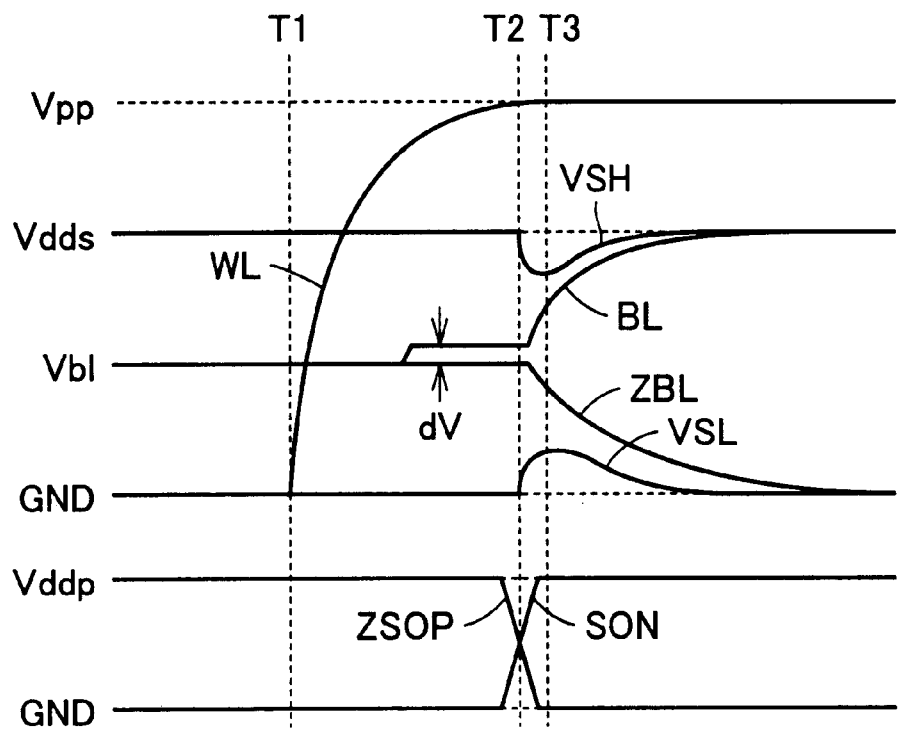
FIG. 8 is a timing chart showing an operation of a sense amplifier shown in FIG. 7.
Figure 9:
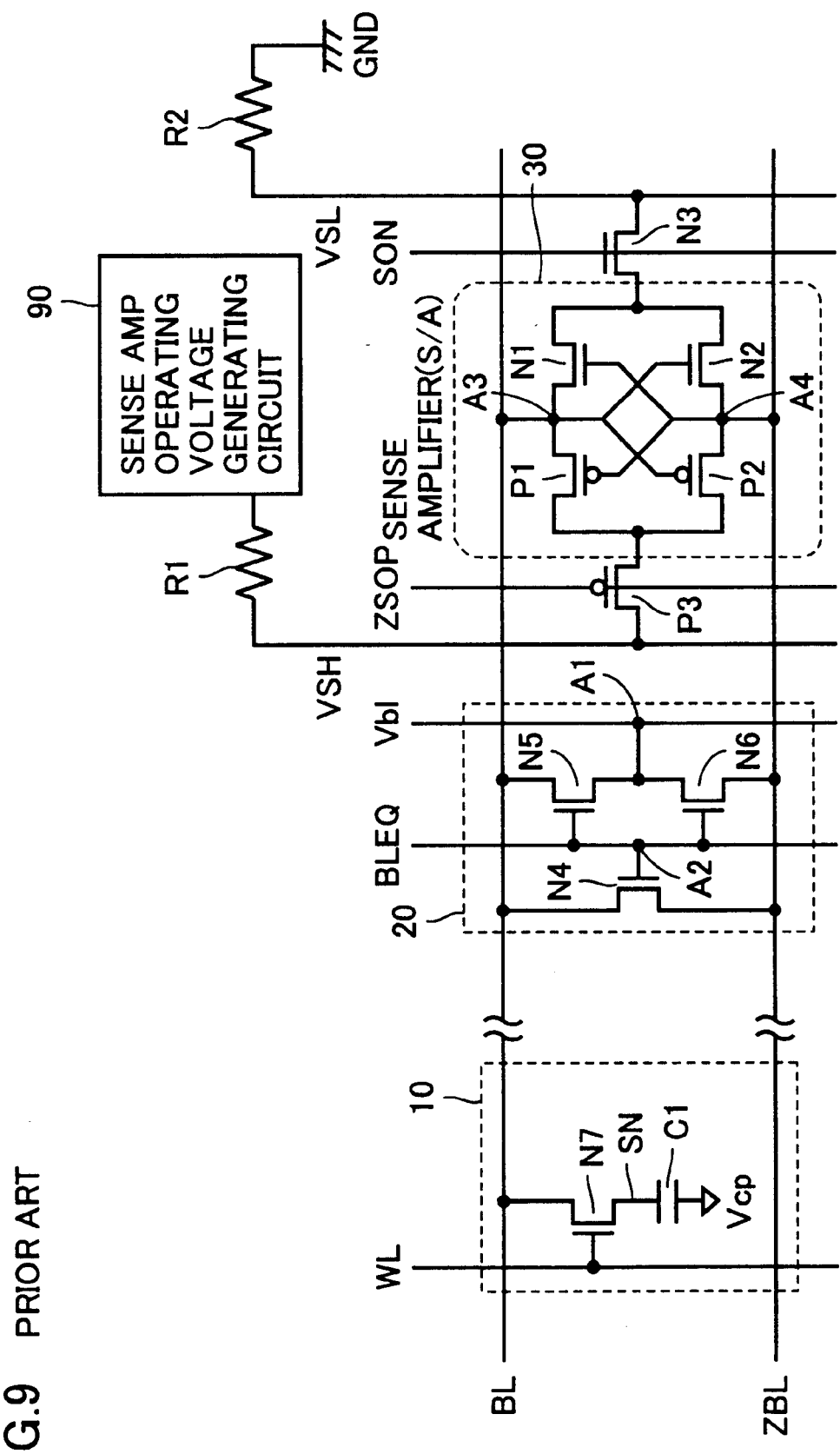
FIG. 9 is a circuit diagram showing a partial structure of a memory cell array in a DRAM including a sense amplifier drive circuit according to an overdrive method.

FIG. 6 is a circuit diagram of a sense amplifier operating voltage generating circuit according to a third embodiment of the present invention.

Referring to FIG. 6, sense amplifier operating voltage generating circuit 700 includes, instead of reference potential generating circuit 401 shown in FIG. 1, a reference potential generating circuit 701 generating two reference potentials Vref and Vrefs, and an auxiliary VDC circuit 800 is further provided as compared with the circuitry shown in FIG. 1. Reference potential Vrefs is set to be equal to an array operating potential Vdds.

Figure 10:
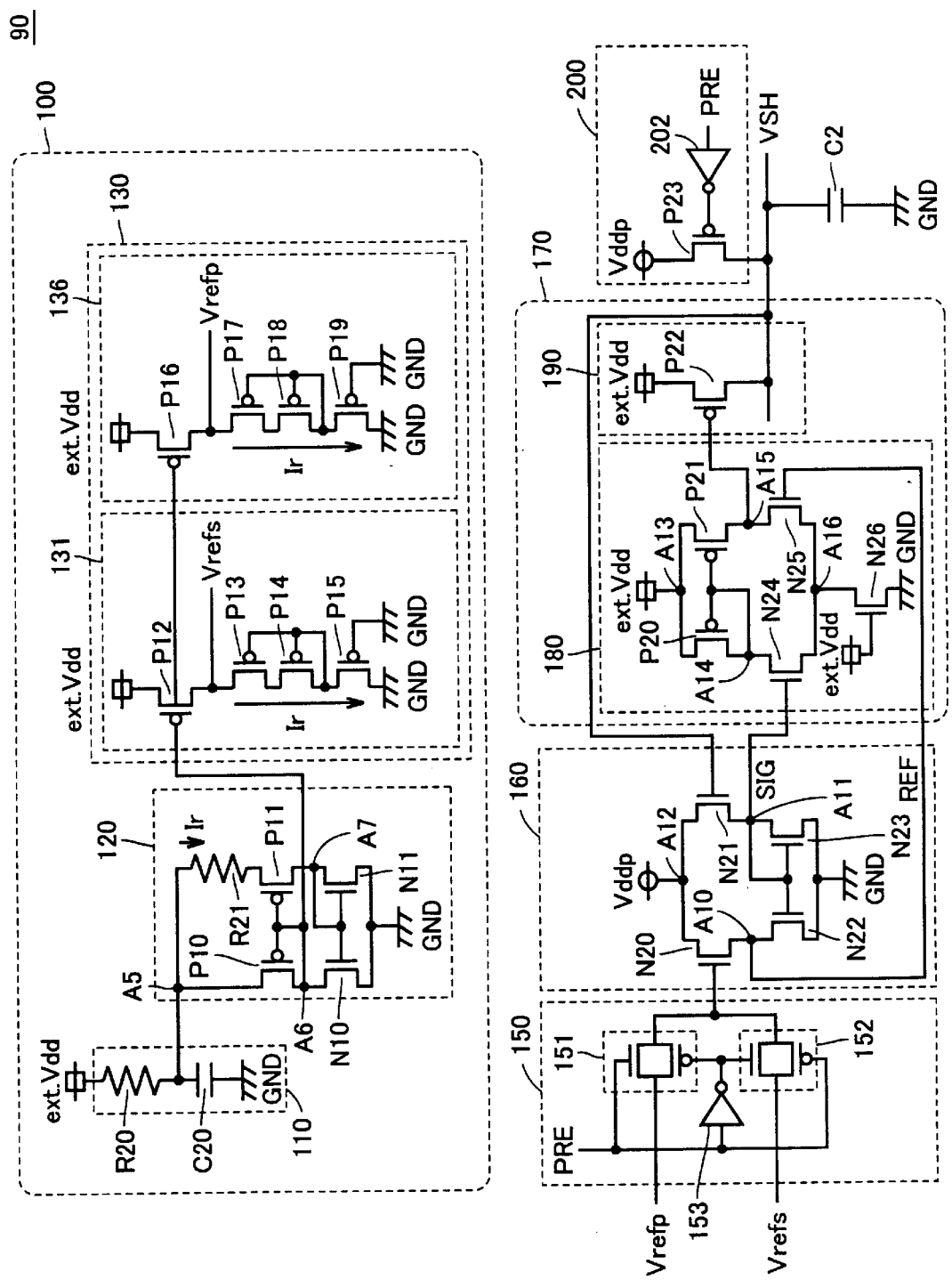
FIG. 10 is a circuit diagram of a sense amplifier operating voltage generating circuit in FIG. 9.
Figure 11:
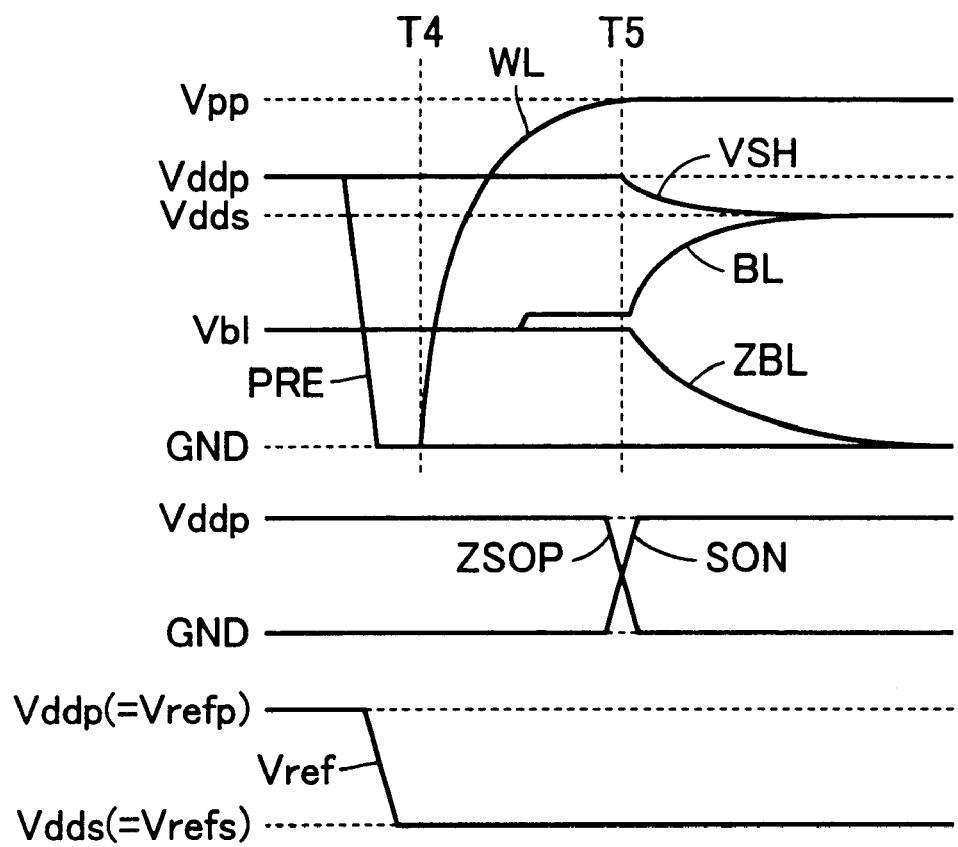
FIG. 11 is a timing chart showing an operation of the sense amplifier operating voltage generating circuit shown in FIG. 10.
Figure 12:
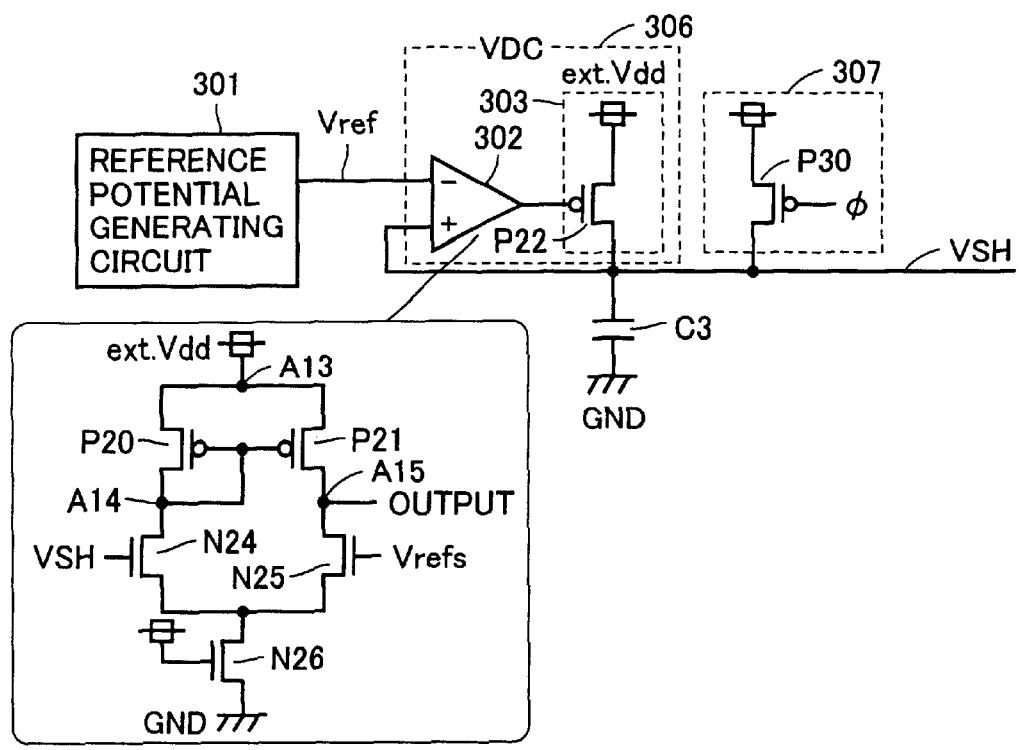
FIG. 12 is a circuit diagram of a sense amplifier drive circuit according to a second overdrive method.
Figure 13:
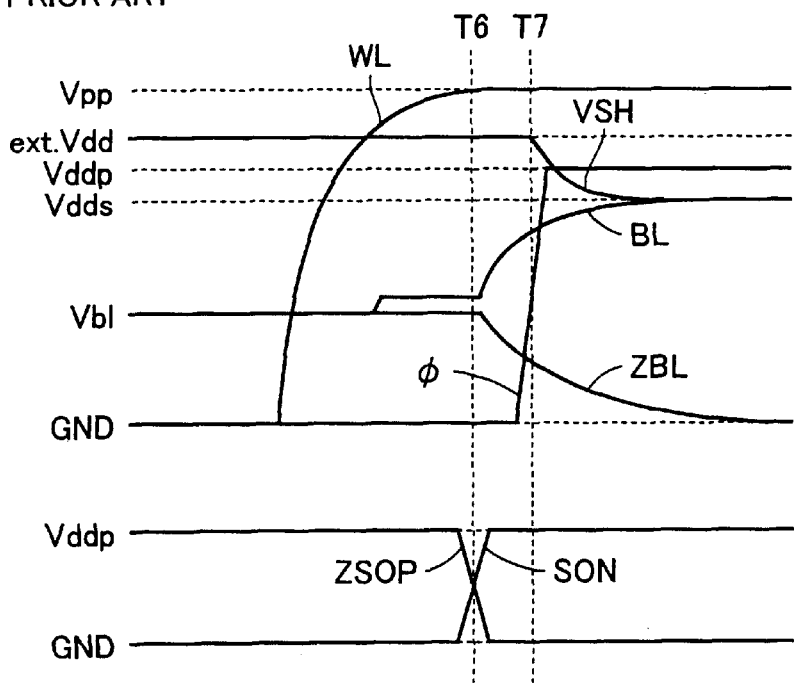
FIG. 13 is a timing chart showing an operation of a sense amplifier operating voltage generating circuit shown in FIG. 12.

Reference potential generating circuit 701 outputs reference potential Vref to a comparator 402 and outputs reference potential Vrefs to auxiliary VDC circuit 800. Reference potential generating circuit 701 has the same circuit structure as that of reference potential generating circuit 100 shown in FIG. 10 and description thereof is not repeated. Although reference potentials Vref and Vrefs are generated by the same circuit in FIG. 6, reference potentials Vref and Vrefs may be generated by different circuits respectively.

Auxiliary VDC circuit 800 includes a comparator 801 and a P channel driver circuit 802.

Comparator 801 has the same circuit structure as that of comparator 402 and description thereof is not repeated. Comparator 801 receives reference potential Vrefs and precharge potential Vpre to output a signal DO2 to a P channel MOS transistor P80 in P channel driver 802. Comparator 801 further receives a signal SED to operate when signal SED is at H level and stop its operation when signal SED is at L level.

Auxiliary VDC circuit 800 is designed to supply a potential equal to array operating potential Vdds to sense power supply line VSH.

Although the circuit is structured for reference potential Vrefs equal to array operating potential Vdds (Vrefs=Vdds) in FIG. 6, the relation Vrefs=Vdds is not necessarily required if any appropriate shift circuit is provided in a preceding stage of auxiliary VDC circuit 800. It is only necessary that a potential provided from auxiliary VDC circuit 800 is equal to array operating potential Vdds.

Sense amplifier operating voltage generating circuit 700 having the above circuit structure operates as described below.

Here, array operating potential Vdds equal to an H data potential to be written into a memory cell is a constant potential lower than potential ext.Vdd (min) which is the lower limit of external supply potential ext.Vdd in terms of specification.

When the capacitance of a decoupling capacitor C10 is represented by equation (6) and decoupling capacitor C10 is charged so that potential Vpre on sense power supply line VSH is equal to potential ext.Vdd (min) in a precharge operation, the potential on sense power supply line VSH is always higher than array operating potential Vdds in a sensing operation. Then, charges are never supplied in the sensing operation from auxiliary VDC circuit 800 to sense power supply line VSH.

On the other hand, if decoupling capacitor C10 is charged so that potential Vpre on sense power supply line VSH in a precharge operation is lower than potential ext.Vdd (min), a final potential on sense power supply line VSH in a sensing operation could be lower than array operating potential Vdds. In this case, the operation is controlled to supply charges from auxiliary VDC circuit 800 and make the potential on sense power supply line VSH equal to array operating potential Vdds.

In this way, the auxiliary VDC circuit operating in a sensing operation is provided in the sense amplifier operating voltage generating circuit to allow the potential on sense power supply line VSH to be equal to array operating potential Vdds in the sensing operation even if there is a shortage of charges for charging of the decoupling capacitor in a precharge operation due to variation of external supply potential ext.Vdd.

When the capacitance of decoupling capacitor C10 provided in sense amplifier operating voltage generating circuit 700 is smaller than the value determined by equation (6), auxiliary VDC circuit 800 can be operated in a sensing operation to achieve the equal potential on sense power supply line VSH to array operating potential Vdds in the sensing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a bit line pair;
   a memory cell connected to one of said bit line pair;
   a sense amplifier for amplifying a potential difference on said bit line pair generated by reading of data from said memory cell; and
   a sense amplifier operating voltage generating circuit for supplying a voltage to said sense amplifier in an active period of said sense amplifier,
   said sense amplifier operating voltage generating circuit including
      an internal potential supply node connected to said sense amplifier,
      a first voltage supply circuit for outputting, when an external supply voltage is higher than a predetermined voltage, said predetermined voltage as an output voltage to said internal potential supply node and outputting, when said external supply voltage is lower than the predetermined voltage, a voltage equal to said external supply voltage as the output voltage to said internal potential supply node, and
      a decoupling capacitor connected to said internal potential supply node.

2. The semiconductor integrated circuit device according to claim 1, wherein
   said first voltage supply circuit is stopped from operating in the active period of said sense amplifier.

3. The semiconductor integrated circuit device according to claim 2, wherein
   said first voltage supply circuit includes
      a reference voltage generating circuit for outputting a voltage lower than said predetermined voltage as a reference voltage,
      a shift circuit for reducing said output voltage to output the reduced voltage, and
      a voltage downconverter circuit receiving said reference voltage and said reduced voltage to output said output voltage.

4. The semiconductor integrated circuit device according to claim 3, wherein
   said voltage downconverter circuit includes
      a comparator circuit receiving said reference voltage and said reduced voltage to output a result of comparison between said reference voltage and said reduced voltage, and a switching element connected between an external supply node receiving said external supply voltage and said internal potential supply node, and said switching element receives the result of comparison from said comparator circuit to control the output voltage of said internal potential supply node.

5. The semiconductor integrated circuit device according to claim 3, wherein said shift circuit includes a plurality of resistance elements connected in series between said internal potential supply node and a ground node.

6. The semiconductor integrated circuit device according to claim 3, wherein said shift circuit includes a first transistor and a second transistor connected in series between an external supply node and a ground node, and said output voltage is input to a control electrode of said first transistor and said reference voltage is input to a control electrode of said second transistor.

7. The semiconductor integrated circuit device according to claim 1, wherein said sense amplifier operating voltage generating circuit further includes a second voltage supply circuit for outputting said predetermined voltage to said internal potential supply node when said output voltage held in said decoupling capacitor by charging is lower than the predetermined voltage in an inactive period of said sense amplifier.

8. The semiconductor integrated circuit device according to claim 7, wherein said second voltage supply circuit supplies said predetermined voltage in the active period of said sense amplifier.

9. The semiconductor integrated circuit device according to claim 7, wherein said predetermined voltage is a lower limit of the external supply voltage determined by a specification.

* * * * *